United States Patent [19]

Shimizu

[11] Patent Number: 4,980,302
[45] Date of Patent: Dec. 25, 1990

[54] METHOD OF MANUFACTURING BIPOLAR TRANSISTOR HAVING A REDUCED PARASITIC CAPACITANCE

[75] Inventor: Junzoh Shimizu, Tokyo, Japan
[73] Assignee: NEC Corporation, Tokyo, Japan
[21] Appl. No.: 446,364
[22] Filed: Dec. 5, 1989
[30] Foreign Application Priority Data Dec. 5, 1988 [JP] Japan .................. 63-308210

[51] Int. Cl.⁵ .......................... H01L 21/331
[52] U.S. Cl. ........................ 437/31; 437/32;
437/33; 437/38; 437/69; 437/162; 437/164;
437/203
[58] Field of Search ............ 437/31, 32, 33, 38,
437/69, 70, 78, 162, 164, 203, 228; 357/34, 35,
55

[56] References Cited

U.S. PATENT DOCUMENTS 4,492,008 1/1985 Anantha et al. .................. 437/31
4,642,880 2/1987 Mitzutani et al. ................ 437/228

*Primary Examiner*—Brian E. Hearn
*Assistant Examiner*—T. N. Quach
*Attorney, Agent, or Firm*—Sughrue, Mion, Zinn, Macpeak & Seas

[57] ABSTRACT

A bipolar semiconductor device comprises a substrate, a collector region formed of an epitaxial layer of a first conduction type formed on the substrate, a field oxide layer formed on the epitaxial layer so as to define a device formation zone in a device isolation manner, a recess formed in the device formation zone in alignment with an edge of the field oxide layer, a polycrystalline silicon layer of a second conduction type opposite to the first conduction type and formed on a side wall of the recess and on the field oxide layer, and an base region composed of a graft base region and an active base region. The graft base region is formed of a diffused region of the second conduction type formed in the epitaxial layer within the device formation zone by diffusion of impurity from the polycrystalline silicon layer of the second conduction type, and the active base region is formed of a doped region of the second conduction type formed integrally with the polycrystalline silicon layer of the second conduction type under a bottom surface of the recess. The semiconductor device also comprises an insulating layer formed to cover the polycrystalline silicon layer of the second condution type, a polycrystalline silicon layer of the first conduction type formed on at least a bottom of the recess, and an emitter region formed of a diffused region of the first conduction type formed in the diffused region of the second conduction type by diffusion of impurity from the polycrystalline silicon layer of the first conduction type.

5 Claims, 4 Drawing Sheets

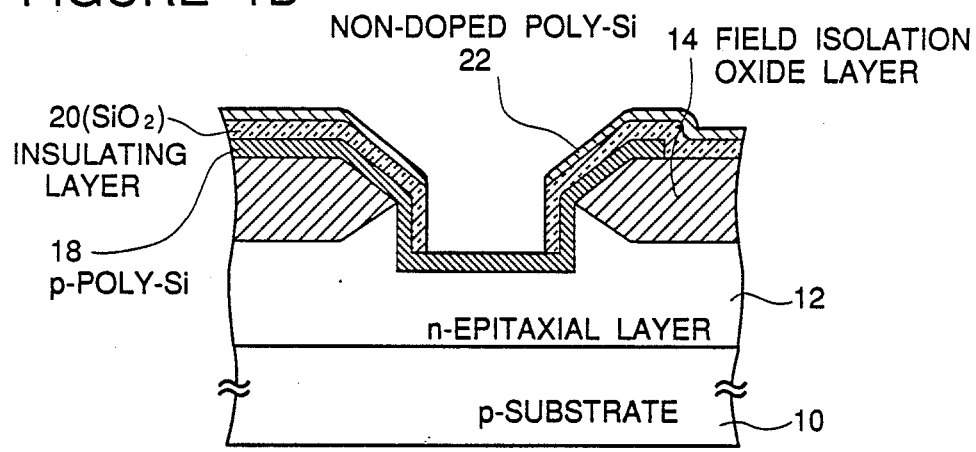
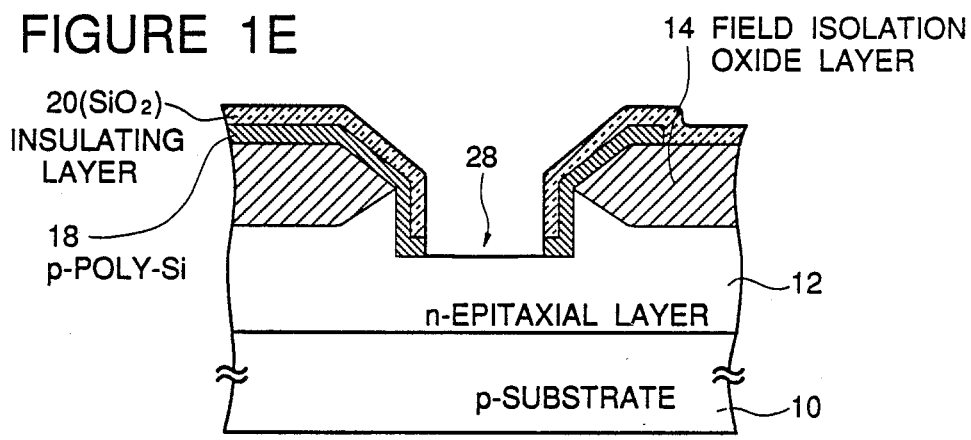
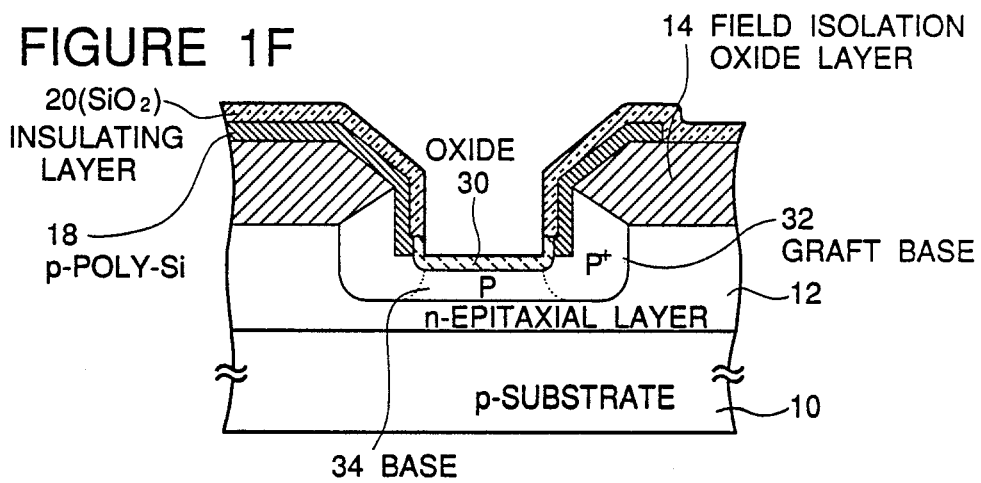

METHOD OF MANUFACTURING BIPOLAR TRANSISTOR HAVING A REDUCED PARASITIC CAPACITANCE

BACKGROUND OF THE INVENTION

1. Field of the invention

The present invention relates to a semiconductor device, and more specifically to a semiconductor device including a bipolar transistor having a reduced parasitic capacitance, and a method for manufacturing such a semiconductor device.

2. Description of related art

In the prior art, as means for realizing a high speed bipolar transistor by reducing a base resistance and a junction capacitance, it has been known to form a graft base in a self-alignment manner by using as a diffusion source a polycrystalline silicon film which forms a base electrode.

For example, a n-type epitaxial layer, which forms a n-type collector region, is formed on an upper surface of a silicon substrate. A field isolation oxide layer is then formed on the n-type epitaxial layer by means of a local oxidation of silicon so as to define a device formation zone. Further, an oxide film is formed on the n-type epitaxial layer within the device formation zone surrounded by the field oxide layer. Thereafter, a p-type polycrystalline silicon layer and an insulating layer are formed in the named order to cover the whole upper surface of the substrate. A first window is formed through the insulating layer situated within the device formation zone, and the p-type polycrystalline silicon layer and the oxide film are etched using as a mask the insulating layer having the first window, so that a second window in alignment with the first window and larger than the first window is formed through the p-type polycrystalline silicon layer and the oxide film. In other words, the edge portion of the insulating layer defining the first window overhangs over the edge of the p-type polycrystalline silicon layer defining the second window.

In this condition, a p-type polycrystalline silicon film is filled into a space formed by the n-type epitaxial layer, an inner wall surface of the second window formed in the oxide film and the p-type polycrystalline silicon layer, and the overhanging edge portion of the insulating layer forming the first window. Then, the substrate is heat-treated to the effect that p-type impurities contained in the p-type polycrystalline silicon film are diffused into the n-type epitaxial layer to form p+ type graft base region on the upper surface of the n-type epitaxial layer. Thereafter, an insulating film for isolating an emitter electrode and a base electrode from each other is formed on an inner vertical wall of each of the p-type polycrystalline silicon film and the insulating layer and on an upper surface of the insulating layer. Thereafter, p-type impurities are ion-implanted into an exposed area of the n-type epitaxial layer, so as to form a p-type active base region in a surface portion of the n-type epitaxial layer surrounded by the p+ graft base region. Then, a polycrystalline silicon film is deposited on the exposed area of the epitaxial layer and on the above mentioned insulating film for isolating an emitter electrode and a base electrode from each other, and n-type impurities are ion-implanted so as to bring the deposited polycrystalline silicon film into an n-type and also to form an n-type emitter region in a surface portion of the p-type base region under the deposited polycrystalline silicon film.

In the above mentioned semiconductor device manufacturing process, the graft base region is formed in the self-alignment manner, and therefore, it is possible to a base resistance and a collector junction capacitance. However, since the p-type polycrystalline silicon film used for forming the graft base region in the self-alignment manner is formed beneath the overhanging edge portion of the insulating layer defining the first window, namely at an outside of the contour line defined by the first window formed in the insulating layer, the area of the base region including the graft base region becomes larger than an opening having a minimum dimension which can be formed under a current photolithography technique. Therefore, it has been necessary to ensure a margin between the base region and the field isolation oxide layer, and accordingly, the semiconductor device manufactured in accordance with the above mentioned conventional process could not have a reduced MOS parasitic capacitance between the n-type epitaxial layer forming the collector region and the p-type polycrystalline silicon layer which forms the base electrode.

In addition, the window for forming the graft base region and the emitter region is determined by a photolithographic step which is different from that for defining the field isolation oxide layer, and therefore, the above mentioned margin has to be further enlarged by an extra portion corresponding to an amount of mismatching between the two mask patterns used.

SUMMARY OF THE INVENTION

Accordingly, it is an object of the present invention to provide a semiconductor device and a manufacturing method thereof which have overcome the above mentioned defect of the conventional one.

Another object of the present invention is to provide a semiconductor device having a minimum MOS parasitic capacitance between a collector region and a base electrode conductor.

A further object of the present invention is to provide a semiconductor device manufacturing method capable of forming a base region formation window in self-alignment with a field isolation oxide without an extra margin thereby to reducing a MOS parasitic capacitance between a collector region and a base electrode conductor to a minimum extent.

The above and other objects of the present invention are achieved in accordance with the present invention by a semiconductor device comprising a substrate, a collector region formed of an epitaxial layer of a first conduction type formed on the substrate, a field oxide layer formed on the epitaxial layer so as to define a device formation zone in a device isolation manner, a recess formed in the device formation zone in alignment with an edge of the field oxide layer, a polycrystalline silicon layer of a second conduction type opposite to the first conduction type and formed on a side wall of the recess and on the field oxide layer, an base region composed of a graft base region and an active base region, the graft base region being formed of a diffused region of the second conduction type formed in the epitaxial layer within the device formation zone by diffusion of impurity from the polycrystalline silicon layer of the second conduction type, the active base region being formed of a doped region of the second conduction type formed integrally with the polycrystalline silicon layer of the second conduction type under a bottom surface of the recess, an insulating layer formed to cover the polycrystalline silicon layer of the second conduction type, a polycrystalline silicon layer of the first conduction type formed on at least a bottom of the recess, and an emitter region formed of a diffused region of the first conduction type formed in the diffused region of the second conduction type by diffusion of impurity from the polycrystalline silicon layer of the first conduction type.

According to another aspect of the present invention, there is provided a method for manufacturing a semiconductor device comprising the steps of preparing a substrate having an epitaxial semiconductor layer of a first conduction type formed on an upper surface of the substrate, forming a field oxide layer on the epitaxial semiconductor layer so as to define a device formation zone in a device isolation manner, etching the epitaxial semiconductor layer within the device formation zone by using the field oxide layer as a mask, so as to form a recess in the device formation zone in alignment with an edge of the field oxide layer, forming a polycrystalline silicon layer of a second conduction type opposite to the first conduction type on a side wall of the recess and on the field oxide layer, forming an insulating layer to cover the polycrystalline silicon layer of the second conduction type, causing impurity contained in the polycrystalline silicon layer of the second conduction type to diffuse into the epitaxial layer within the device formation zone so as to form a diffused region of the second conduction type in a peripheral portion of the epitaxial layer within the device formation zone, forming a doped region of the second conduction type in a central portion of the epitaxial layer within the device formation zone and integrally with the a diffused region of the second conduction type, forming a polycrystalline silicon layer of the first conduction type on at least a bottom of the recess, and doping impurity of the first conduction type into a surface region of the diffused region of the second conduction type so as to form a diffused region of the first conduction type in the doped region of the second conduction type.

In the semiconductor device manufactured in accordance with the above mentioned process, the epitaxial layer of the first conduction type forms a collector region, the diffused region and the doped region of the second conduction type form a base region, and the diffused region of the first conduction type forms an emitter region.

In a preferred embodiment, the polycrystalline silicon layer of a second conduction type opposite to the first conduction type is formed not only on the side wall of the recess on the field oxide layer, but also on a bottom of the recess, the insulating layer is formed to cover the polycrystalline silicon layer of the second conduction type not only at the side wall of the recess and on the field oxide layer, but also at the bottom of the recess. In addition, the step of forming the diffused region of the second conduction type includes the steps of depositing a non-doped polycrystalline silicon layer on the insulating layer formed to cover the polycrystalline silicon layer of the second conduction type, doping impurity of the first conduction type to a portion of the non-doped polycrystalline silicon layer situated on the bottom of the recess so as to form a first conduction type impurity doped polycrystalline silicon layer on the bottom of the recess, selectively etching the non-doped polycrystalline silicon layer and the first conduction type impurity doped polycrystalline silicon layer situated on the bottom of the recess so as to cause the first conduction type impurity doped polycrystalline silicon layer to be completely removed from the bottom of the recess, but the non-doped polycrystalline silicon layer to still remain, etching the insulating layer by using the remaining non-doped polycrystalline silicon layer as a mask, so as to remove a portion of the insulating layer situated on the bottom of the recess, removing the remaining non-doped polycrystalline silicon layer and the polycrystalline silicon layer of the second conduction type situated on the bottom of the recess by using the remaining insulating layer as a mask, so as to expose the epitaxial layer at the bottom of the recess, and heat-oxidizing an exposed surface of the epitaxial layer at the bottom of the recess thereby to cause the impurity contained in the polycrystalline silicon layer of the second conduction type to diffuse into the epitaxial layer within the device formation zone so as to form the diffused region of the second conduction type in the epitaxial layer within the device formation zone.

The above and other objects, features and advantages of the present invention will be apparent from the following description of a preferred embodiment of the invention with reference to the accompanying drawings.

BRIEF DESCRIPTION OF THE DRAWINGS

FIGS. 1A to 1G are diagrammatic sectional views illustrating various steps of an embodiment of the semiconductor device manufacturing method in accordance with the present invention.

DESCRIPTION OF THE PREFERRED EMBODIMENTS

Referring to FIGS. 1A to 1G, there are diagrammatic sectional views illustrating various steps of an embodiment of the semiconductor device manufacturing method in accordance with the present invention.

Figure 1A:
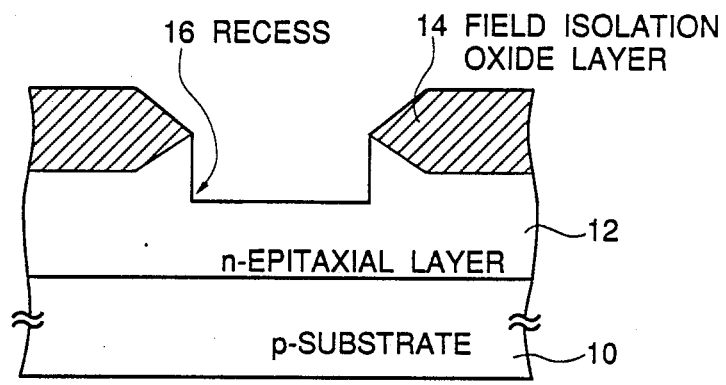

As shown in FIG. 1A, on a p-type silicon substrate 10, an n-type epitaxial layer 12 is formed, and then, a field isolation oxide layer 14 is formed by a selective oxidation such as a local oxidation of silicon, so that a device formation zone is defined. This field isolation oxide layer 14 extends downwardly into the n-type epitaxial layer 12 to a depth deeper than a principal surface of the substrate. Thereafter, the device formation zone which is not covered by the field isolation oxide layer 14 is etched by using the field isolation oxide layer 14 as a mask, so that a recess 16 having a depth of 300 nm to 500 nm is formed in a self-alignment with the field isolation oxide layer 14, as shown in FIG. 1A.

Figure 1B:
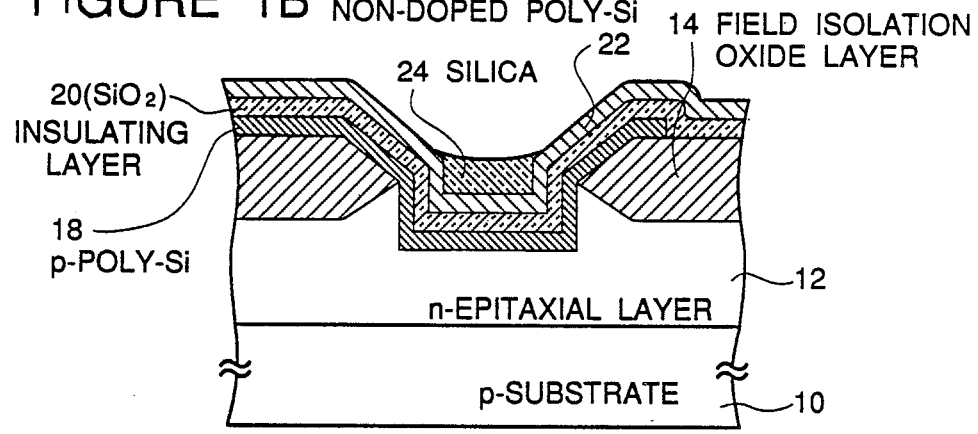

Then, as shown in FIG. 1B, a p-type polycrystalline silicon layer 18 having a thickness of 200 nm to 400 nm is deposited to cover an inner surface of the recess 16 and an upper surface of the field isolation oxide layer 14, and further etched to form a desired pattern of p-type polycrystalline silicon layer 18 which functions as a base electrode and conductor.

Thereafter, an insulating layer 20 such as a silicon oxide layer having a thickness of 200 nm to 400 nm is formed to cover the patterned p-type polycrystalline silicon layer 18, and a polycrystalline silicon layer 22 having a thickness of 200 nm is deposited to cover the insulating layer 20. This polycrystalline silicon layer 22 is doped with no impurity. However, a silica film formation solution containing 4 to 12 mol % of phosphorus is deposited to have a thickness of 100 nm to 200 nm. Further, the substrate is baked at a temperature of about 600° C., and the dried silica is etched to leave a silica film 24 containing the phosphorus only at a bottom of the recess 16.

Figure 1C:
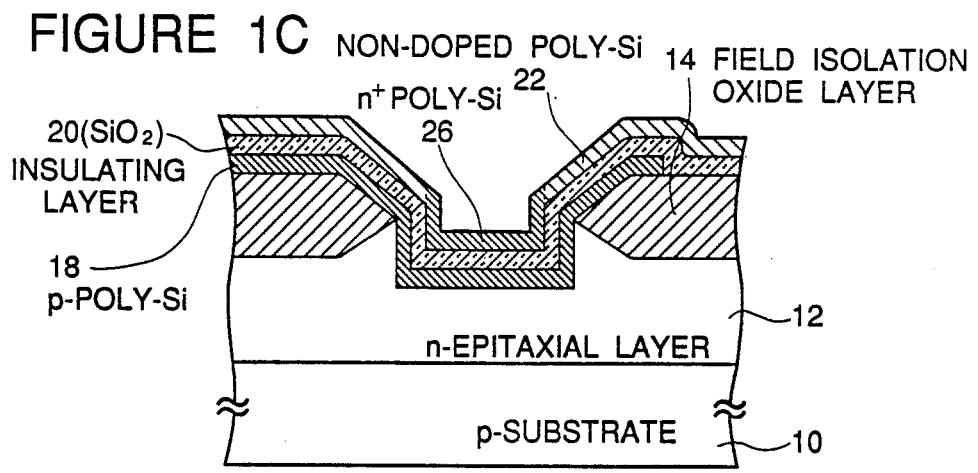
Figure 1G:
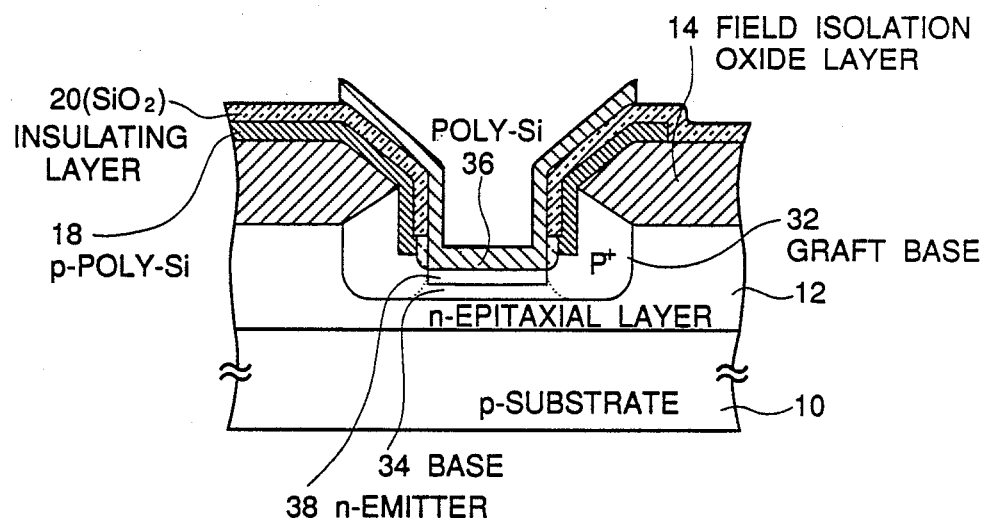

Thereafter, the substrate is heat-treated at a temperature of about 900° C., so that phosphorus contained in the silica film 24 diffuses into the polycrystalline silicon layer 22, so that the polycrystalline silicon layer 22 on the bottom of the recess 16 is converted into an n+ polycrystalline silicon layer 26. Then, the silica film 24 is removed by a hydrofluoric acid (HF), as shown in FIG. 1C.

As shown in FIG. 1D, the non-doped polycrystalline silicon layer 22 and the n+ polycrystalline silicon layer 26 are etched by a reactive ion etching using a gas including carbon and chlorine. In this reactive ion etching, since the etching rate for the n+ polycrystalline silicon layer 26 is about double of that for the non-doped polycrystalline silicon layer 22, the n+ polycrystalline silicon layer 26 on the bottom of the recess 16 are removed in a self-alignment manner, and on the other hand, the non-doped polycrystalline silicon layer 22 remains. In addition, an exposed insulating layer 20 is anisotropically etched by a reactive ion etching using a fluorocarbon gas, by using the remaining non-doped polycrystalline silicon layer 22 as a mask, as shown in FIG. 1D.

Thereafter, the remaining non-doped polycrystalline silicon layer 22 and the p+ polycrystalline silicon layer 18 within an opening defined by the remaining insulating layer 20 are removed so that the n-type epitaxial layer 12 within the opening is exposed as shown in FIG. 1E.

Then, the exposed n-type epitaxial layer 12 within the opening is heat-oxidized to form an silicon oxide layer 30 on the n-type epitaxial layer 12. In this heat-oxidation process, p-type impurities (for example, boron) contained in the p-type polycrystalline silicon layer 18 is diffused into the n-type epitaxial layer 12, so that a p+ graft base region 32 is formed, as shown in FIG. 1F. In addition, p-type impurities is ion-implanted into the bottom of the recess 16 through the oxide layer 30, so that a p-type active bass region 34 is formed integrally with the p+ graft base region 32 under the oxide layer 30.

The oxide layer 30 is anisotropically removed by a reactive ion etching, and thereafter, a polycrystalline silicon layer 36 is deposited on the exposed p-type base region 34. Then, arsenic is ion-implanted to the deposited polycrystalline silicon layer 36 and through deposited polycrystalline silicon layer 36 to the p-type region 32, so that an n-type emitter region 38 is formed in the p-type base region 32. Thereafter, the arsenic-doped deposited polycrystalline silicon layer 36 is patterned.

Figure 2:
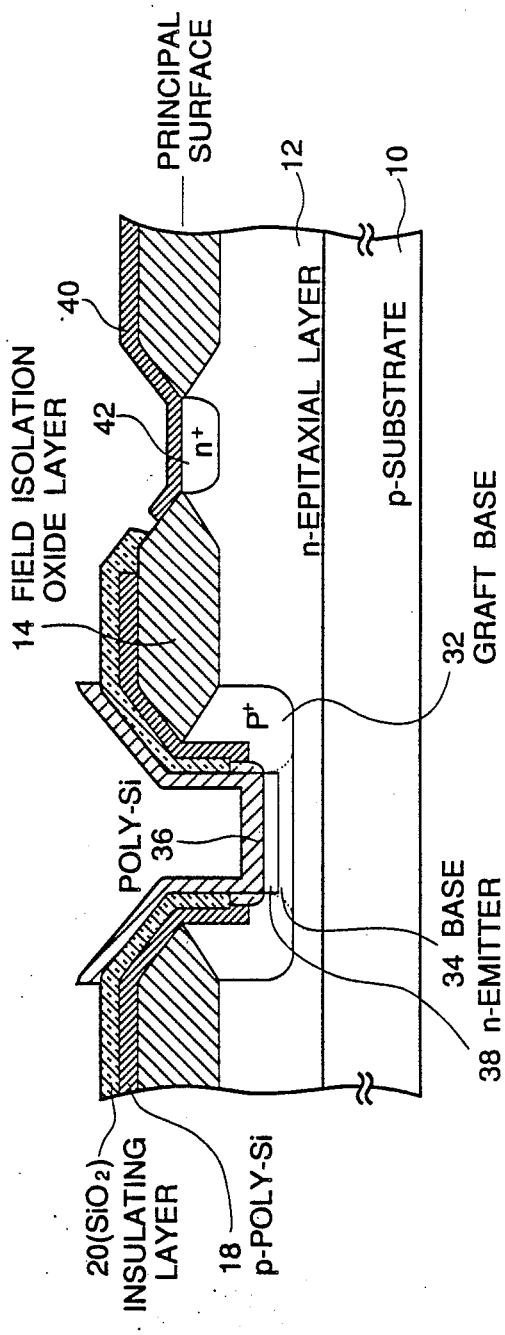
FIG. 2 is a diagrammatic sectional view illustrating an embodiment of the semiconductor device in accordance with the present invention.

In the semiconductor device thus formed, the patterned p-type polycrystalline silicon layer 18 forms a base electrode and wiring conductor, and the patterned arsenic-doped deposited polycrystalline silicon layer 36 forms an emitter electrode and wiring conductor. In addition, as shown in FIG. 2, a collector electrode and wiring conductor 40 is formed in contact with an n+ region 42 formed in the n-type epitaxial layer 12. Thus, an npn bipolar transistor is formed.

As seen from the above mentioned description with reference to the drawings, the p-type polycrystalline silicon layer 18 functioning as the base electrode and wiring conductor extends from the graft base region 32 along a vertical wall of the recess 16 formed in alignment with the field isolation oxide 14, and also extends from an upper edge of the recess 16 directly onto the field isolation oxide 14. Namely, there is no thin insulating layer formed at the inside of the field isolation oxide. Therefore, the p-type silicon layer 18 extending from the graft base region has no portion extending over the thin insulating layer formed at the inside of the field isolation oxide. In other words, the p-type silicon layer 18 extending from the graft region and the n-type epitaxial layer 12 forming the collector region are separated only by the thick field isolation oxide. As a result, a MOS parasitic capacitance between the collector region 12 and the base electrode and wiring conductor 18 can be greatly reduced as compared with the conventional one in which a portion of a base electrode and wiring conductor extends over the insulating layer formed at the inside of the field isolation oxide.

Furthermore, the diffusion source for formation of the graft base region 32 has a horizontal size (or lenght or width) corresponding to a sum of the thickness of the p-type silicon layer 18 and the thickness of the insulating layer 20. In other words, the thickness of the p-type silicon layer 18 and the thickness of the insulating layer 20 are precisely controlled. Therefore, the diffusion source for formation of the graft base region 32 can have a precisely controlled horizontal size, as compared with the diffusion source formed under the overhanging edge portion of the insulating layer in the conventional process, since the amount of overhang is difficult to control.

In addition, the thick oxide layer 14 for a device isolation is selectively formed, and the graft base region 32 is formed in alignment with an edge of the device isolation thick oxide layer 14, and thereafter, the emitter region 38 is formed in alignment with the base region. If the device isolation pattern is designed to realize the above mentioned relation, a plurality of different diffusion layers are all formed in a self-alignment manner. Therefore, it is not necessary to provide for a margin including an amount of mismatching between different patterns, and accordingly, it is possible to reduce a transistor to a minimum size required. In addition, the number of mask patterns used can be reduced by three or four as compared with the conventional method.

The invention has thus been shown and described with reference to the specific embodiment. However, it should be noted that the present invention is in no way limited to the details of the illustrated structures but changes and modifications may be made within the scope of the appended claims.

I claim:

1. A method for manufacturing a semiconductor device comprising the steps of preparing a substrate having an epitaxial semiconductor layer of a first conduction type formed on an upper surface of the substrate, forming a field oxide layer on said epitaxial semiconductor layer so as to define a device zone in a device isolation manner, etching the epitaxial semiconductor layer within said device formation zone by using said field oxide layer as a mask, so as to form a recess in said device formation zone in alignment with an edge of said field oxide layer, forming a polycrystalline silicon layer of a second conduction type opposite to the first conduction type on a side wall of said recess and on the field oxide layer, forming an insulating layer to cover said polycrystalline silicon layer of the second conduction type, causing impurity contained in said polycrystalline silicon layer of the second conduction type to diffuse into said epitaxial layer within said device formation zone so as to form a diffused region of the second conduction type in a peripheral portion of said epitaxial layer within said device formation zone, forming a doped region of the second conduction type in a central portion of said epitaxial layer within said device formation zone and integrally with said a diffused region of the second conduction type, forming a polycrystalline silicone layer of the first conduction type on at least a bottom of said recess, and doping impurity of the first conduction type into a surface region of said diffused region of the second conduction type so as to form a diffused region of the first conduction type in said doped region of the second conduction type, whereby said epitaxial layer of the first conduction type forms a collector region, said diffused region and said doped region of the second conduction type form a base region, and said diffused region of the first conduction type forms an emitter region.

2. A method claimed in claim 1 wherein said polycrystalline silicon layer of a second conduction type opposite to the first conduction type is formed not only on said side wall of said recess and on the field oxide layer, but also on a bottom of said recess, said insulating layer is formed to cover said polycrystalline silicon layer of the second conduction type not only at said side wall of said recess and on the field oxide layer, but also at said bottom of said recess, and wherein the step of forming said diffused region of the second conduction type includes the steps of depositing a non-doped polycrystalline silicon on said insulating layer formed to cover said polycrystalline silicon layer of the second conduction type, doping impurity of the first conduction type to a portion of said non-doped polycrystalline silicon layer situated on said bottom of said recess so as to form a first conduction type impurity doped polycrystalline silicon layer on the bottom of said recess, selectively etching said non-doped polycrystalline silicon layer and said first conduction type impurity doped polycrystalline silicon layer situated on the bottom of said recess so as to cause said conduction type impurity doped polycrystalline silicon layer to be completely removed from the bottom of said recess, but said non-doped polycrystalline silicon layer to still remain, etching said insulating layer by using the remaining non-doped polycrystalline silicon layer as a mask, so as to remove a portion of said insulating layer situated on the bottom of said recess, removing the remaining non-doped polycrystalline silicon layer and said polycrystalline silicon layer of the second conduction type situated on the bottom of said recess by using the remaining insulating layer as a mask, so as to expose said epitaxial layer at said bottom of said recess, and heat-oxidizing an exposed surface of said epitaxial layer at said bottom of said recess thereby to cause the impurity contained in said polycrystalline silicon layer of the second conduction type to diffuse into said epitaxial layer within said device formation zone so as to form said diffused region of the second conduction type in said epitaxial within said device formation zone.

3. A method claimed in claim 2 wherein the step of forming said first conduction type impurity doped polycrystalline silicon layer on the bottom of said recess includes the step of applying a solution containing impurity of the first conduction type on said non-doped polycrystalline silicon layer in said recess, drying said solution to form a residue containing the impurity of the first conduction type on said non-doped polycrystalline silicon layer situated on said bottom of said recess, heat-treating to cause the impurity of the first conduction type contained in said residue to diffuse into said non-doped polycrystalline silicon layer situated on said bottom of said recess, and removing said residue.

4. A method claimed in claim 3 wherein the step of forming said doped region of the second conduction type includes the step of ion-implanting the impurity of the second conduction type into said epitaxial layer within said device formation zone through the heat-oxidized layer formed at said exposed surface of said epitaxial layer at said bottom of said recess.

5. A method claimed in claim 3 wherein the step of forming said diffused region of the first conduction type in said doped region of the second conduction type includes the step of removing the heat-oxidized layer formed at said exposed surface of said epitaxial layer in said bottom of said recess so as to expose said doped region of the second conduction type within said recess, depositing a polycrystalline silicon layer on an exposed surface of said doped region of the second conduction type within said recess, ion-implanting the impurity of the first conduction type into said doped region of the second conduction type within said recess through said polycrystalline silicon layer formed on said exposed surface of said doped region of the second conduction type.

* * * * *

UNITED STATES PATENT AND TRADEMARK OFFICE
CERTIFICATE OF CORRECTION

PATENT NO. : 4,980.302
DATED : December 25, 1990
INVENTOR(S) : Junzoh SHIMIZU

It is certified that error appears in the above-identified patent and that said Letters Patent is hereby corrected as shown below:

Col. 6, line 20, delete "lenght" and insert --length--;

Col. 6, line 58, after "device" insert --formation--;

Col. 7, line 10, delete "silicone" and insert --silicon--

Col. 7, line 32, after "silicon" insert --layer--;

Col. 8, line 14, after "epitaxial" insert --layer--.

Signed and Sealed this

Twenty-ninth Day of September, 1992

Attest:

DOUGLAS B. COMER

*Attesting Officer*  *Acting Commissioner of Patents and Trademarks*